United States Patent
Kim

[19]

[11] Patent Number: 5,949,398
[45] Date of Patent: Sep. 7, 1999

[54] SELECT LINE DRIVER FOR A DISPLAY MATRIX WITH TOGGLING BACKPLANE

[75] Inventor: Hongjin Kim, Princeton, N.J.

[73] Assignee: Thomson Multimedia S.A., Paris, France

[21] Appl. No.: 08/631,484

[22] Filed: Apr. 12, 1996

[51] Int. Cl.[6] .................................................. G09G 3/36
[52] U.S. Cl. ........................... 345/100; 345/87; 345/96; 345/99; 37/64; 37/75
[58] Field of Search .................................. 345/87, 89, 94, 345/98, 100, 99, 92, 96; 377/78, 79, 75, 64

[56] References Cited

U.S. PATENT DOCUMENTS

| | | | |
|---|---|---|---|
| 5,055,709 | 10/1991 | Smith ....................................... | 307/279 |
| 5,055,720 | 10/1991 | Tiede ........................................ | 307/279 |
| 5,170,155 | 12/1992 | Plus et al. . | |
| 5,222,082 | 6/1993 | Plus ........................................... | 377/79 |
| 5,410,583 | 4/1995 | Weisbrod et al. ......................... | 377/75 |
| 5,434,899 | 7/1995 | Huq et al. .................................. | 377/79 |
| 5,701,136 | 12/1997 | Huq et al. .................................. | 345/100 |

FOREIGN PATENT DOCUMENTS

| | | | |
|---|---|---|---|
| 0336570 A1 | 11/1989 | European Pat. Off. ......... | G09G 3/36 |
| 0404025 A2 | 12/1990 | European Pat. Off. ......... | G09G 3/36 |
| 05186943 A2 | 12/1992 | European Pat. Off. ......... | G09G 3/36 |

OTHER PUBLICATIONS 14.5: Capacitively Coupled Driving of TFT–LCD by Nagata, et al., pp. 242–245, SID 89 Digest.
A Compensative Driving Method For Common Electrode Voltage Distortion in TFT–LCDS by Tomita, et al., pp. 235–238.
Driver Circuits for AMLCDs by Lewis, et al., pp. 56–64.
(RCA 87842) Ser. No. 08/399,014, filed Mar. 6, 1995 by Huq, et al., entitled A Liquid Crystal Display Driver With Threshold Voltage Drift Compensation.

*Primary Examiner*—Richard A. Hjerpe
*Assistant Examiner*—Kent Chang
*Attorney, Agent, or Firm*—Joseph S. Tripoli; Joseph J. Laks; Sammy S. Henig

[57] ABSTRACT

When a given row in an array of a liquid crystal display having a toggling backplane voltage is de-selected, the row select line voltage also toggles to prevent capacitive current in the pixel capacitance. The row select line driver includes a pair of transistors coupled in a push-pull configuration. The pair of transistors are responsive to a control signal that is produced in a corresponding stage of cascaded stages of a shift register. The pair of transistors form a buffer stage that prevents the toggling voltage developed in the row select line when the row is de-selected from affecting the operation of the shift register.

14 Claims, 5 Drawing Sheets

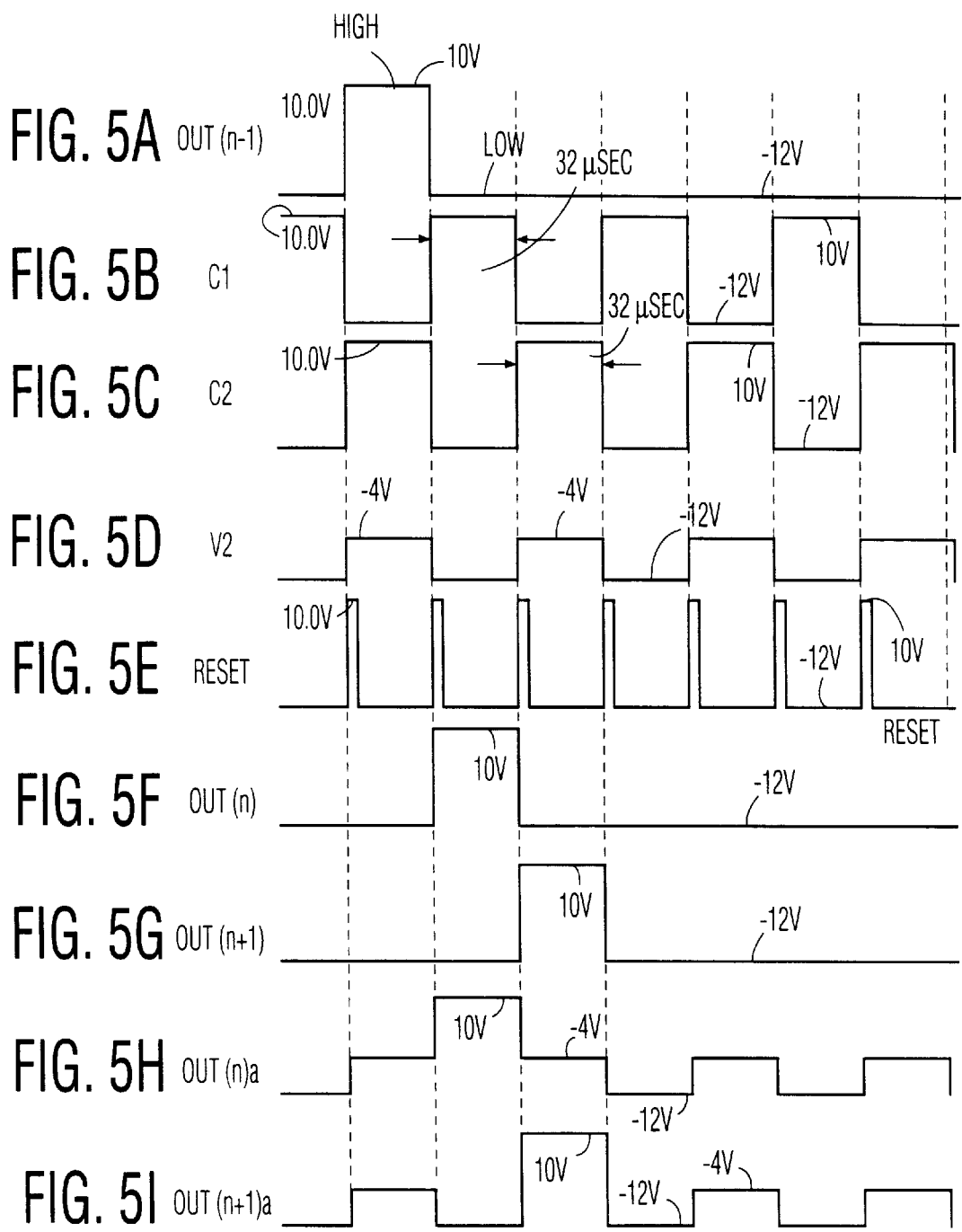

SELECT LINE DRIVER FOR A DISPLAY MATRIX WITH TOGGLING BACKPLANE

The invention relates generally to drive circuits for display devices and particularly to a system for applying row select line signals to row select lines of a display device, such as a liquid crystal display (LCD).

Display devices, such as LCD's, are composed of a matrix or an array of pixel cells arranged, for example, horizontally in rows and vertically in columns. The video information to be displayed is applied as brightness (gray scale) signals to data lines which are individually associated with each column of pixel cells. A given data line driver develops a drive signal in the corresponding data line. U.S. Pat. No. 5,170,155 in the names of Plus et al., entitled "System for Applying Brightness Signals To A Display Device And Comparator Therefore", describes an example of a data line or column driver of an LCD. The rows of pixel cells are sequentially scanned or selected by row select signals developed in row line conductors that are associated with the rows of pixel cells.

In an active matrix display, each pixel cell includes a switching device which applies the brightness signal to the pixel cell. Typically, the switching device is a thin film transistor (TFT) switch which receives the brightness signal through the data line from the data line driver. This device is referred to herein as the pixel TFT. The pixel TFT has a gate electrode that is connected to the row select line conductor and responsive to the row select signal associated with the row of the pixel cell.

Liquid crystal displays are composed of a liquid crystal material which is sandwiched between two electrodes. At least one, and typically both of the electrodes, is transparent to light and the surfaces of the electrodes which are adjacent to the liquid crystal material support patterns of transparent conductive electrodes arranged in a pattern to form the individual pixel cell. Typically, one of the electrodes of the pixel cell is at a voltage that is common to all the pixel cells of the array. That electrode is referred to as the backplane or common plane of the array. The other electrode of the pixel cell that is remote from the backplane is connected to a main current conducting electrode of the pixel TFT switch and is referred to as the pixel electrode. The TFT develops a voltage level at the pixel electrode approximately the same voltage level of the brightness signal. The difference between the voltage level at the pixel electrode and that at the backplane is referred to herein as the pixel cell voltage.

In order to prevent polarization of the liquid crystal material in the pixel cell, the polarity of the pixel cell voltage has to alternate periodically such that the average value or DC component of the pixel cell voltage is zero. One known technique for preventing the polarization of the liquid crystal material in the pixel cell is referred to as the toggling common plane or backplane voltage technique.

In the toggling backplane voltage technique, when a given row is selected, the backplane voltage is at one of first and second voltage levels. Whereas, when the same row is selected, in the course of updating the picture information of a successively occurring picture frame, the backplane voltage is at the other one of the first and second voltage levels. The voltage level of the brightness signal that produces pixel cell brightness at the mid-range of the gray scale, is referred to herein as the mid-range voltage level. In the toggling backplane voltage technique, the mid-range voltage level is the same regardless of the level of the backplane voltage.

One of the first and second levels is more positive or larger than the maximum level of the brightness signal produced in the data line driver. The other one of the first and the second levels is less positive or smaller than the minimum level of the brightness signal. The first and second levels of the backplane voltage are symmetrical with respect to the mid-range level of the brightness signal. Consequently, when the backplane voltage is at the first level, the pixel cell voltage in the pixel cell of the selected row is at opposite polarity to that developed when the backplane voltage is at the second level. The result is that the polarity of the pixel cell voltage, throughout the given picture frame, is always opposite to that occurring, throughout the successively occurring picture frame. This is called frame inversion. In this way, polarization of the liquid crystal material is avoided.

Disadvantageously, the toggling backplane voltage at the frame frequency may produce flicker at frequencies to which the eye is sensitive. To reduce the eye sensitivity, the backplane voltage can toggle at the higher frequency of row selection change. The voltage that is applied to the backplane changes from the first level to the second level, and vice versa, when the immediately following row is selected. This mode of operation is called line inversion because the polarity of the pixel voltage changes on a row-by-row basis. As in the case of the frame inversion, the polarity of the pixel cell voltage is also inverted every frame to avoid polarization of the liquid crystal material.

A shift register, referred to as select scanner, embodying an inventive feature, develops a row select signal at a corresponding row select line conductor appropriate for the row inversion mode of operation. The same voltage level is produced at the row select line conductor of the selected row regardless of the level of the backplane voltage at the time the row is selected. This feature results from the consideration of spatial uniformity and flicker. The pixel cell voltage depends on the conductivity of the pixel TFT.

To reduce the flicker and to reduce the difference in pixel brightness on alternately selected rows, it is desirable to maintain the same conductivity in the pixel TFT when a row is selected both when the backplane voltage is at the first level and at the second level. Maintaining the same conductivity is particularly important when the brightness signal is at the mid-range voltage level. This is so because the eye is highly sensitive to brightness variation when the brightness signal is at the mid-range voltage level. The pixel TFT conductivity is determined by the voltage at the row line conductor of the selected row and by the voltage level of the brightness signal. Since the mid-range voltage level and the voltage level at the row line conductor are the same regardless the backplane voltage level, the pixel TFT, advantageously, maintains the same conductivity.

The select scanner also develops a row de-select signal at a corresponding row select line conductor appropriate for the row inversion mode of operation. This is achieved by generating at the row select line conductor of the de-selected row a second toggling voltage that changes by the same amount and at the same time as the toggling backplane voltage, during the row de-select interval. This feature results from the consideration of temporal uniformity and flicker. Toggling the voltage of the row select signal in step with the toggling of the backplane voltage maintains a constant difference between backplane voltage and the voltage at the row select line conductor, throughout the row de-selection interval. Therefore, a displacement or capacitive current in a current path that includes the pixel cell capacitance is reduce or eliminated. Any displacement current could have produced a change in the pixel cell voltage resulting in undesirable effects such as flicker and image sticking.

It may be desirable to fabricate the select line scanner of an LCD display matrix with a toggling backplane voltage onto the same substrate and at the same time the liquid crystal display cells are fabricated in the display matrix.

A display apparatus, embodying an aspect of the invention, for applying brightness signals to pixels arranged in a plurality of rows and in a plurality of columns of an array, includes a plurality of column drivers for developing the brightness signals at pixel electrodes of pixels of a given row when the given row is selected. A source of a toggling, first signal is provided. The first signal is developed in common electrodes of the pixels having, alternately, first and second levels with respect to a predetermined level of the brightness signal. A plurality of stages form a row select scanner. A given one of the stages that is associated with the given row includes a first transistor for generating a row line select signal in a corresponding row line to select the given row, during a given row select interval. A second transistor coupled to the row line develops a voltage in a capacitance associated with the row line, in accordance with the first signal. The capacitance capacitively couples the first signal to the row line to develop a toggling row line de-select signal at the row line that is level shifted with respect to the first signal in accordance with the capacitance voltage, during a row de-select interval.

FIGS. 5a–5i are diagrams of the relative timing of the output signals and the respective clock signals occurring at respective nodes of the FIG. 3 shift register utilizing stages illustrated in FIG. 4.

Figure 1:
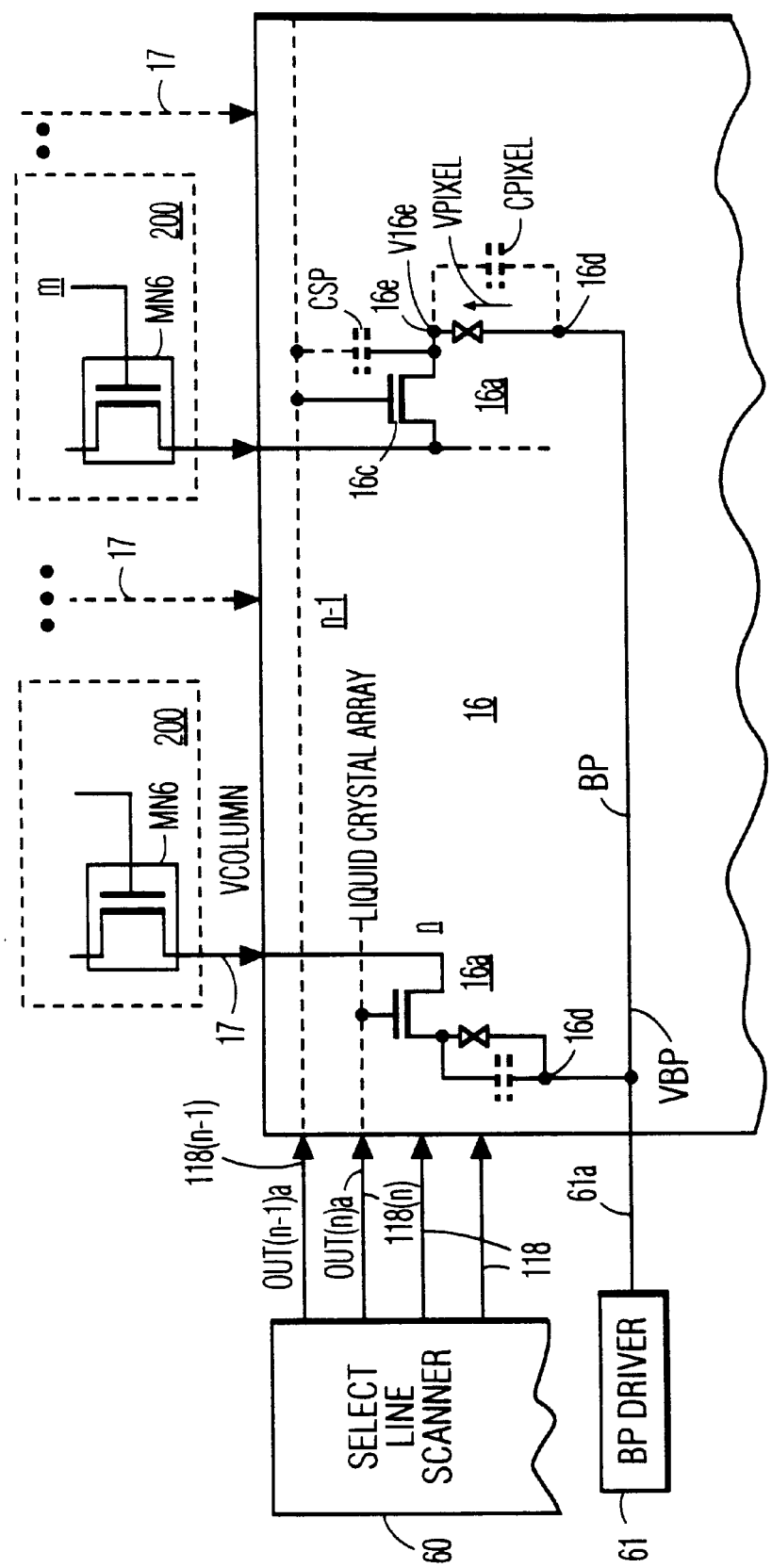
FIG. 1 illustrates a block diagram of a liquid crystal display arrangement that includes a row select driver, embodying an aspect of the invention.

In FIG. 1, conventional data line drivers 200, that drive data lines 17 of a liquid crystal array 16, may be, for example, similar in many respects to that explained in the Plus et al., patent. Each data line driver 200 is coupled to the corresponding data line 17 via a transistor MN6. Array 16 is composed of a large number of pixel cells, such as a liquid crystal cell 16a, arranged horizontally in, for example, 560 rows and vertically in 960 columns. Liquid crystal array 16 includes 960 columns of data lines 17, one for each of the vertical columns of liquid crystal cells 16a, and 560 row select lines 118, one for each of the horizontal rows of liquid crystal cells 16a.

A select line scanner 60, embodying an aspect of the invention, produces a row select signal OUT(n)a on a corresponding select line 118(n) for selecting a given row n of array 16. A brightness voltage VCOLUMN developed in a given data line 17 is applied, during the line select period of row n, to pixel cells 16a on the row.

A voltage VBP developed at an electrode 16d of each pixel cell 16a is common to all the pixel cells of array 16. Electrode 16d in which common voltage VBP is developed is referred to as an electrode of a backplane BP of array 16. In a given pixel cell 16a, a second electrode 16e of pixel cell 16a that is remote from backplane BP is coupled to a corresponding pixel TFT switch 16c. This electrode is referred to as pixel electrode. When corresponding row n is selected, pixel TFT 16c develops at pixel electrode 16e a voltage V16e at approximately the same voltage level of the corresponding brightness voltage VCOLUMN.

Figure 2:
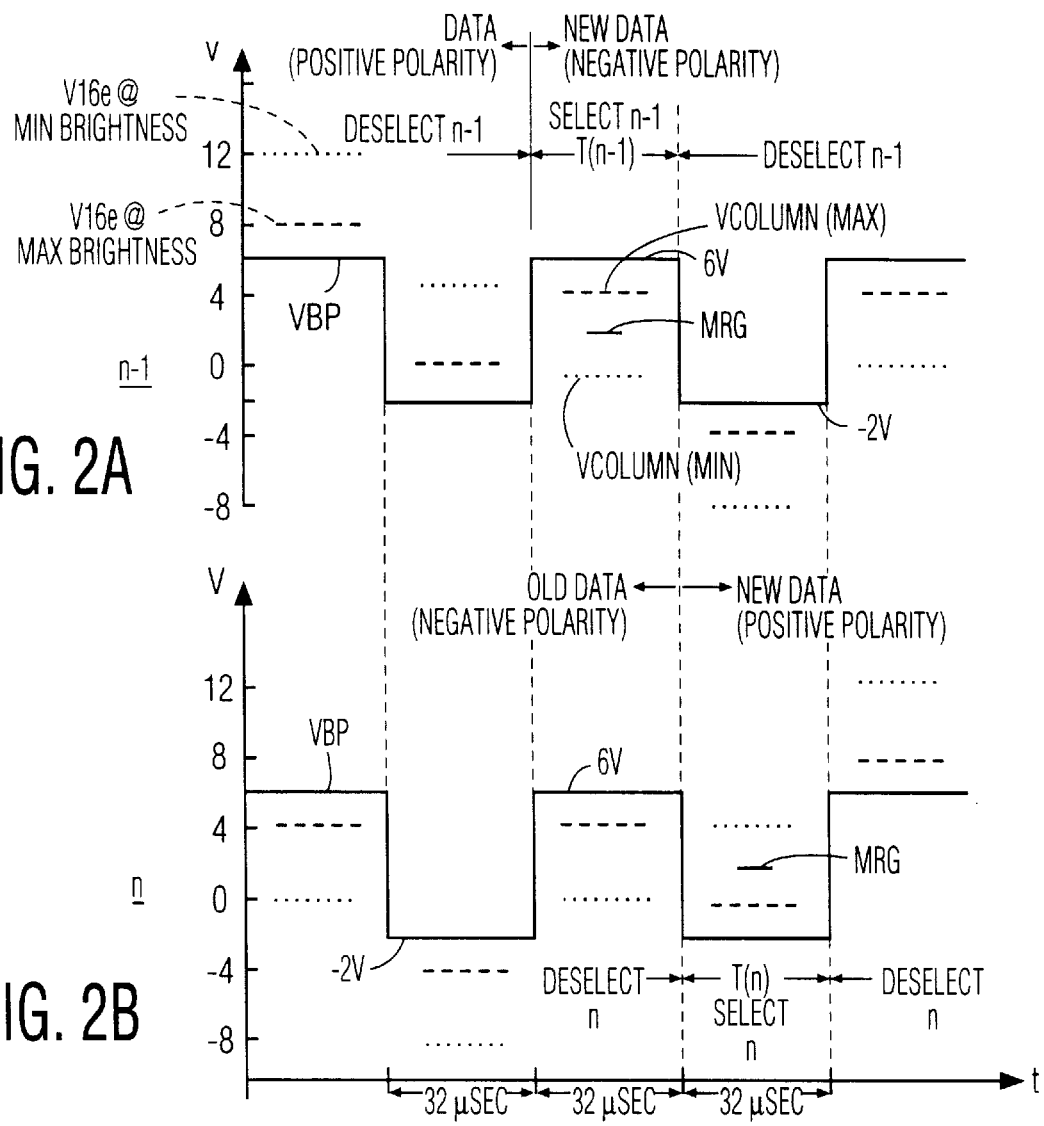
FIGS. 2a and 2b illustrate waveforms for explaining the arrangement of FIG. 1.

FIGS. 2a and 2b illustrate examples of waveforms of voltages that are developed at backplane electrode 16d and at pixel electrode 16e of each pixel cell of a pair of pixel cells 16a of FIG. 1 of immediately selected rows n−1 and n, respectively.

Similar symbols and numerals in FIGS. 1, 2a and 2b indicate similar items or functions.

Backplane voltage VBP of FIG. 2a or 2b that is applied to backplane BP of matrix 16 of FIG. 1 toggles when the row selection changes. During a transition interval when backplane voltage VBP toggles, each of transistor MN6 of FIG. 1 is turned off. Backplane voltage VBP, produced in a conventional backplane driver 61, is +6V, during a line time T(n−1), of FIG. 2a, when row select signal OUT(n−1)a of FIG. 1 is developed on row select line 118(n−1) of selected row n−1. Backplane voltage VBP is −2V, during a line time T(n), of FIG. 2b, when row select signal OUT(n)a of FIG. 1 is developed on row select line 118(n) of the immediately following selected row n.

Voltage V16e of FIG. 2a or 2b is approximately equal to voltage VCOLUMN when the row of pixel 16a is selected. Voltage VCOLUMN has a voltage range, typically between a maximum of +4V and a minimum of 0V, that is the same for each row. Using the same voltage range facilitates the design of the data line drivers 200.

The +6V level of backplane voltage VBP of FIG. 2a is more positive than the maximum level, +4V, of brightness voltage VCOLUMN. The −2V level of backplane voltage VBP is less positive or more negative than the minimum level 0V of brightness voltage VCOLUMN. A pixel cell voltage VPIXEL of pixel cell 16a of the selected row is equal to a difference between pixel electrode voltage V16e and backplane voltage VBP. When backplane voltage VBP is at +6V, pixel cell voltage VPIXEL in the pixel cell of the selected row is negative and at opposite polarity to that developed when backplane voltage VBP is at −2V. In the example shown, the polarity of pixel cell voltage VPIXEL changes from a negative polarity, in selected row n−1, during line time T(n−1) of FIG. 2a, to the positive polarity, in immediately selected row n, during line time T(n) of FIG. 2b. Thus the polarity of voltage VPIXEL alternates on a row-by-row basis.

For a given change in light transmissiveness or brightness, the direction of change of brightness voltage VCOLUMN is opposite in selected rows n−i and n. When, during line time T(n−1) of FIG. 2a, brightness voltage VCOLUMN is at a voltage level that is larger than a mid-range voltage level MRG, it produces, for example, a higher pixel light transmissiveness or brightness than when it is at mid-range voltage level MRG. Whereas, during line time T(n) of FIG. 2b, brightness voltage VCOLUMN is at a voltage level that is larger than mid-range voltage level MRG, it produces a lower pixel light transmissiveness or brightness than when it is at mid-range voltage level MRG.

Voltage level MRG represents a brightness level at the middle of a gray scale of the brightness. Thus, for example, for obtaining the same light transmissiveness in pixels of rows n−1 and n, a difference between voltage VCOLUMN and voltage level MRG has to be of the same magnitude and opposite polarity.

FIGS. 2a and 2b show the voltage level of voltage V16e at pixel electrode 16e that provides maximum light transmissiveness or brightness, by a broken line, and minimum light transmissiveness, by a dotted line. Because backplane voltage VBP toggles on a row-by-row basis, the polarity of pixel cell voltage VPIXEL also changes on a row-by-row basis.

When a given row is selected, in the course of updating the picture information of a given picture frame, backplane voltage VBP is at one of +6V and −2V voltage levels. Whereas, when the same row is selected, in the course of updating the picture information of an immediately occurring picture frame, backplane voltage VBP is at the other one of +6V and −2V voltage levels. The result is that the polarity of pixel cell voltage VPIXEL, throughout the given picture frame, is always opposite to that occurring, throughout the immediately occurring picture frame. In this way, polarization of the liquid crystal material is avoided, as mentioned earlier. Changing the polarity of voltage VPIXEL on a row-by-row basis reduces flicker.

Figure 3:
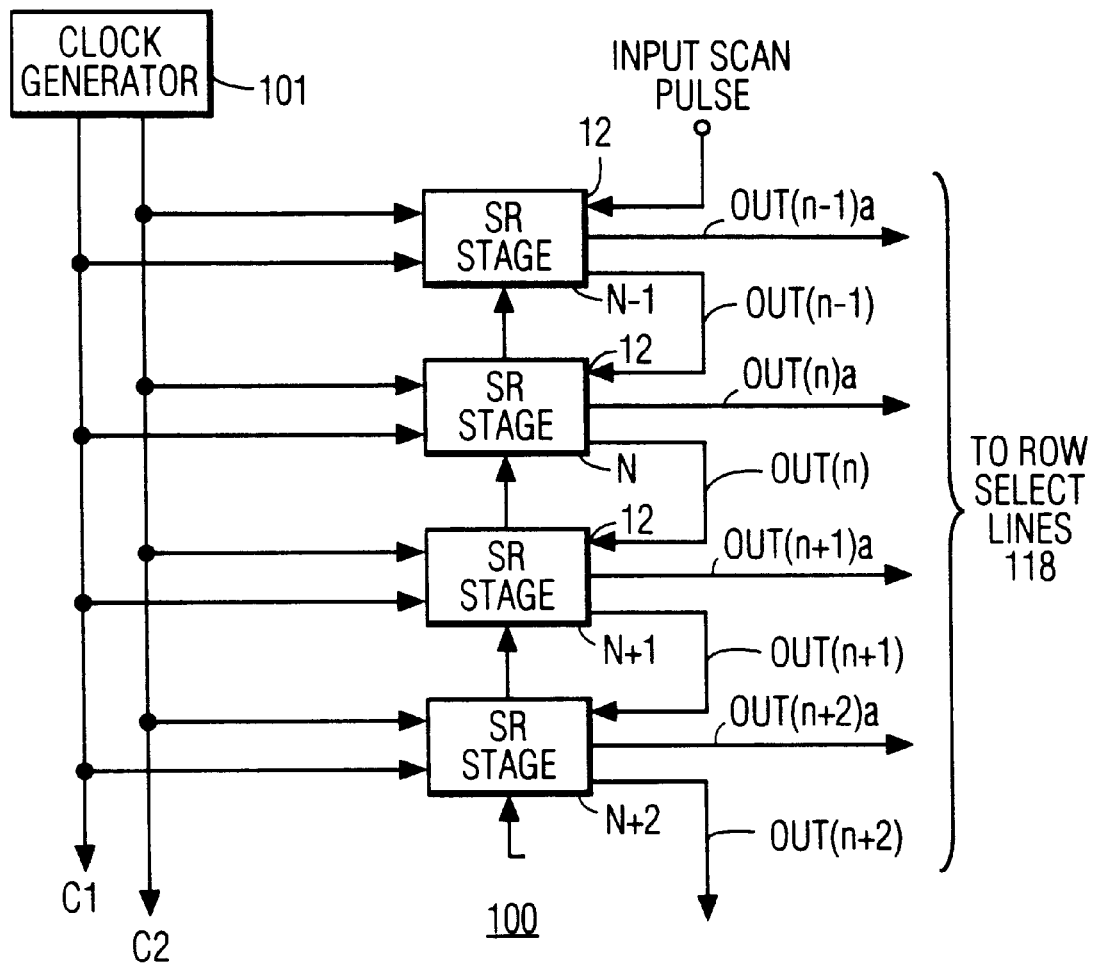
FIG. 3 illustrates a block diagram of the row select driver of FIG. 1 that includes a shift register including a plurality of cascaded stages.
Figure 4:
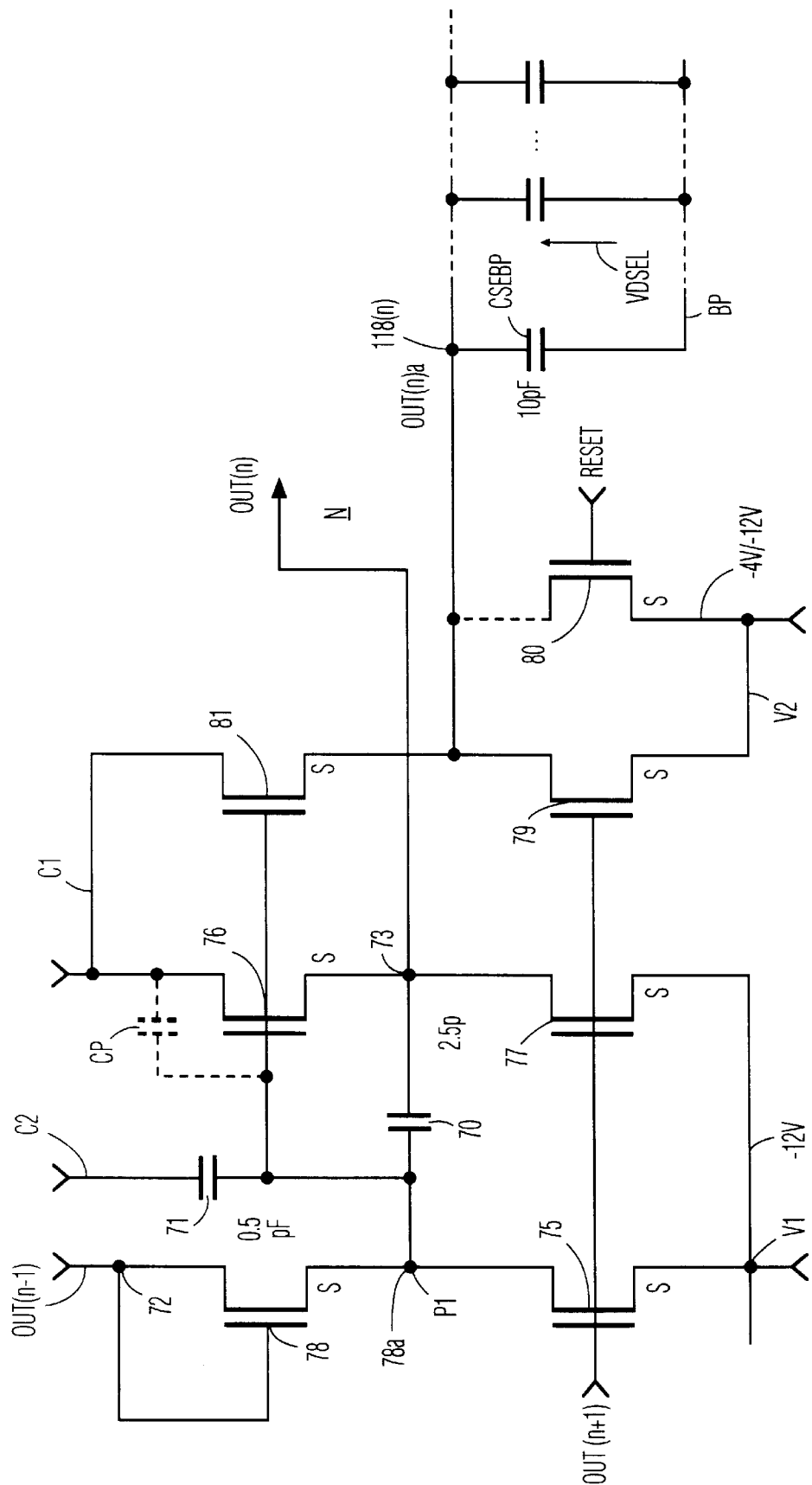
FIG. 4 illustrates a schematic diagram of a shift register stage, embodying an aspect of the invention, that is used in the shift register of FIG. 3.

FIG. 4 illustrates an exemplary stage N, embodying an inventive feature, of a shift register 100 of FIG. 3 of select line scanner 60 of FIG. 1. Each transistor of stage N is an N-MOS TFT. The time when each transistor is conductive is small relative to the time it is nonconductive in order to reduce stress that can cause threshold voltage drift. Shift register 100 of FIG. 3 provides the timings for driving row select lines 118 of liquid crystal display matrix 16 in FIG. 1. Similar symbols and numerals in FIGS. 1, 2a, 2b, 3 and 4 indicate similar items or functions.

In shift register 100 of FIG. 3, stages N−1, N, N+1 and N+2 are coupled to one another in a cascade configuration. An output signal of a given stage is coupled to an input of the immediately following stage in the chain. For example, a pulse of output signal OUT(n−1) of preceding stage N−1 in the chain of register 100 is coupled to an input terminal 72 of stage N of FIG. 4. Illustratively, only four stages, N−1, N, N+1 and N+2 are shown in FIG. 3. However, the total number of stages N in the chain of register 100 is the same as the number of row select lines, 560 in this example. Shift register 100 may be referred to as a "walking one" shift register. This is so because a TRUE state or HIGH level propagates through register 100 during a video picture frame time.

FIGS. 5a–5i illustrate waveforms useful for explaining the circuits of FIGS. 3 and 4. Similar symbols and numerals in FIGS. 1, 2a, 2b, 3, 4 and 5a–5i indicate similar items or functions.

A clock generator 101 of FIG. 3 produces a two-phase clock signal, (clock signals C1 and C2) having waveforms that are shown in FIGS. 5b and 5c, respectively. The pulse of output signal OUT(n−1) of FIG. 3a is developed at an input terminal 72 of stage N of FIG. 4, during the pulse of clock signal C2 of FIG. 5c. Signal OUT(n−1) of FIG. 5a at the HIGH level is coupled, via a transistor 78 of FIG. 4, to a terminal 78a for developing a control signal P1. Control signal P1 is coupled to a gate electrode of a first output transistor 76.

When control signal P1 is developed at the gate electrode of transistor 76 of FIG. 4, a drain electrode of transistor 76 is at a negative, LOW level of clock signal C1. Signal P1 that is developed at the gate of output transistor 76 conditions output transistor 76 for conduction. Conductive transistor 76 forms a current path for temporarily storing the HIGH level of signal P1 in a capacitor 70 that is coupled between the gate and source electrodes of conductive transistor 76. Clock signal C1 is also coupled via an interelectrode parasitic capacitance CP of transistor 76 to terminal 78a. Consequently, the HIGH level of signal P1 is also stored in capacitance CP. The HIGH level remains stored in capacitor 70 and capacitance CP even after signal OUT(n−1) of FIG. 5a attains the LOW level and transistor 78 of FIG. 4 is turned off.

Clock signal C1 of FIG. 5b is developed at the HIGH level at the drain electrode of transistor 76 immediately after the pulse of clock signal C2 ceases or attains the LOW level. Clock signal C1 of FIG. 5b is coupled via conductive transistor 76 to an output terminal 73. Consequently, as it attains the HIGH level, it bootstraps up the voltage at terminal 78a through capacitors 70 and CP, thus providing extra drive to transistor 76. Such operation is referred to as bootstrap operation. Consequently, output pulse signal OUT (n) of FIG. 5f is developed at output terminal 73 of register N of FIG. 4 without voltage drop from the HIGH level of signal C1.

Signal P1 is also coupled to the gate electrode of a buffer output transistor 81 embodying an inventive feature. A drain of transistor 81 is coupled to clock signal C1. Transistor 81 is turned on and off at the same times as transistor 76. Whenever transistor 81 of stage N is turned on, it generates a pulse of row select signal OUT(n)a on select line 118(n) of matrix 16 of FIG. 1.

In accordance with an inventive feature, signal P1 that is stored in capacitor 70 after transistor 78 is turned off, is coupled to the gate of transistor 81. Thus, advantageously, bootstrap operation is performed in both transistors 76 and 81 when clock signal C1 is generated. The bootstrap operation makes row select signal OUT(n)a to attain the HIGH level of clock signal C1 without voltage drop. Because transistor 76 need not drive the relatively large capacitive load of select line 118(n), the transition time of signal OUT(n) is, advantageously, fast.

Voltage level MRG of brightness voltage VCOLUMN that produces pixel cell brightness at the mid-range does not depend on the voltage level of backplane voltage VBP at the time the row is selected. Consequently, when row n is selected, a difference between the voltage level of row select signal OUT(n)a of FIG. 4 and brightness voltage VCOLUMN at the mid-range voltage level MRG of FIG. 2a or 2b is the same both when backplane voltage VBP of FIG. 2a is at +6V and when backplane voltage VBP of FIG. 2b is at −2V. Therefore, advantageously, when brightness voltage VCOLUMN is at the mid-range voltage level MRG, the conductivity of pixel TFT16c of FIG. 1 is the same both when the backplane voltage is at +6V and at −2V.

Maintaining the same conductivity in TFT switch 16c when a given row is selected both when backplane voltage VBP is +6V and −2V is desirable. This is so because any difference in conductivity could have produced a non-zero average value of pixel cell voltage VPIXEL which can cause flicker and/or image sticking. Maintaining the same conductivity is particularly important when brightness signal VCOLUMN is at the mid-range voltage level MRG of FIG. 2a or 2b because of the high senitivity of the eye to variations of brightness at the middle of the gray scale.

Signal OUT (n) of stage N of FIG. 4 is applied to an input terminal of subsequent stage N+1 of FIG. 3. Stage N+1 is located downstream in the signal path of register 100 and operates similarly to stage N except for utilizing complementary clock signal C2, instead of clock signal C1 in stage n, for turning on the corresponding transistors. Thus, signal OUT(n+1) of FIG. 5g, occurring during clock signal C2 of FIG. 5c, has a LOW-to-HIGH level transition, immediately following the HIGH-to-LOW level transition in clock signal C1 of FIG. 5b. The LOW-to-HIGH level transition of signal OUT(n+1) of FIG. 5g occurs as clock signal C2 of FIG. 5c makes the LOW-to-HIGH level transition. Thus, select line scanner 60 of FIG. 1 operates as a shift register.

When clock signal C1 of FIG. 5b attains the inactive LOW level, transistors 76 and 81 of FIG. 4 remain turned on until capacitors 70 and CP discharge. A transistor 75 is coupled between terminal 78a and a constant negative supply voltage V1 of −12V. A transistor 77 is coupled between terminal 73 and negative supply voltage V1.

Signal OUT(n+1) of stage N+1 is coupled back to the gate electrodes of transistors 75 and 77. Signal OUT(n+1) is also coupled to the gate electrode of a pull-down transistor 79, embodying an inventive feature, having source and drain electrodes that are coupled to toggling voltage V2 and select line 118(n) of row n, respectively. Thus, transistors 75, 77 and 79 are turned on, when the pulse of signal OUT(n+1) occurs. When transistors 75 and 77 are turned on, they discharge capacitor 70 and parasitic capacitor CP. This is so because negative supply voltage V1 of −12V is the same as the inactive LOW level of clock signal C1. Thereby, transistors 76 and 81 are turned off. Since signal OUT(n+1) occurs once per frame, which is substantially less frequently than clock signal C1 or C2, any stress in transistors 79, 75 and 77 that could cause a threshold voltage change in the transistors is, advantageously, small.

A capacitance CSEBP is coupled between select line 118(n) of row n and backplane BP. Capacitance CSEBP is used for increasing the coupling capacitance between select line 118(n) of row n and backplane BP.

In accordance with an aspect of the invention, when transistor 79 is turned on, it charges capacitance CSEBP and develops a row de-select voltage VDSEL across capacitance CSEBP.

Voltage VDSEL is equal to a difference between toggling voltage V2 and toggling voltage VBP. It has a constant value of −10V, regardless of which voltage level of voltage VBP occurs.

During the entire de-select interval of row n, following the trailing edge of pulse of signal OUT(n+1), transistor 79 is nonconductive and forms a high impedance with respect to row select line 118(n). Thus, voltage VDSEL −10V is maintained in capacitance CSEBP. Because backplane BP is capacitively coupled to row select line 118(n) via capacitance CSEBP, the voltage level of signal OUT(n)a in row select line 118(n) tracks toggling backplane voltage VBP, throughout the de-select interval. The tracking of row select line 118(n) causes, advantageously, no displacement current that can be generated in a current path that includes pixel capacitance CPIXEL and capacitance CSP of FIG. 1. This is so because transistor MN6 of FIG. 1 is turned off during the transition of toggling voltage VBP, and, consequently, the data columns are decoupled from the data scanner. Therefore, pixel voltage VPIXEL does not change during the de-select interval of row n even though voltage VBP toggles. FIGS. 5h AND 5i illustrate the waveforms of signals OUT(n)a and OUT(n+1)a, respectively, of FIG. 3.

Output terminal 73 of FIG. 4 of transistor 76 is isolated from row select line 118(a). Therefore, the toggling voltage in select line 118(n) does not affect the voltages at terminal 73. Thus the voltage at terminal 73 that is coupled to stage N+1 of FIG. 3 is constant throughout the deselect interval and is not affected by toggling signal OUT(n)a. It follows that each of clock signals C1 and C2 of stage N+1 does not depend on the toggling voltage in select line 118(n) of FIG. 4 and can be a simple bi-level signal. Thus, the design of each stage such as stage N is, advantageously, simplified.

A reset pulse signal RESET of FIG. 5e is coupled to the gate electrode of an optional pull-down transistor 80 of FIG. 4 having source and drain electrodes that are coupled to toggling voltage V2 and a source electrode of transistor 81, respectively. Pulse signal RESET of FIG. 5e is a narrow pulse that occurs each time the row selection occurs, on a row-by-row basis. Transistor 80 may be used for preventing any noise disturbance from affecting the magnitude of voltage VDSEL, during row n de-select interval, when the high impedance is developed in row select line 118(n)a.

During the row n deselect interval, clock signal C1 of FIG. 4 might have a tendency to cause the charging of capacitor 70 via capacitance CP. Therefore, clock signal C2 is coupled to terminal 78a via a capacitnace 71 that is larger by 20% than capacitance CP. Advantageously, capacitive coupled clock signal C2 prevents any charge build-up in capacitor 70, during row n deselect interval.

What is claimed is:

1. A display apparatus for applying brightness signals to pixels arranged in a plurality of rows and in a plurality of columns of an array, comprising:

a plurality of column drivers for developing said brightness signals at pixel electrodes of pixels of a given row when said given row is selected;

a source of a toggling, first signal developed in common electrodes of said pixels having, alternately, first and second levels with respect to a predetermined level of a given brightness signal;

a plurality of stages forming a row select scanner, a given one of said stages that is associated with said given row, including:

a first transistor for generating a row line select signal in a corresponding row line to select said given row, during a given row select interval; and a second transistor coupled to said row line for developing a voltage in a capacitance associated with said row line, in accordance with said first signal, said capacitance capacitively coupling said first signal to said row line to develop a toggling row line de-select signal at said row line that is level shifted with respect to said first signal in accordance with said capacitance voltage, during a row de-select interval.

2. A display apparatus according to claim 1 wherein a difference between said row line de-select signal and said first signal is maintained constant at each of the levels of said first signal.

3. A display driver according to claim 1 wherein said second transistor develops said row line de-select signal at third and fourth levels when said first signal is at said first and second levels, respectively.

4. A display driver according to claim 1 wherein said first and second transistors operate in a push-pull configuration with respect to said row line.

5. An apparatus according to claim 1 wherein said row line select signal is at the same level with respect to said predetermined level of said given brightness signal when said first signal is at each of said first and second levels.

6. A row select line scanner for an array of a display apparatus, comprising:

a plurality of cascaded stages, a given one of said cascaded stages, including:

an input section responsive to an output pulse signal developed at an output of a second stage of said cascaded stages for generating a control signal of said given stage;

a first transistor responsive to said control signal for generating an output pulse signal of said given stage that is coupled to an input section of a third stage of said cascaded stages, said output pulse signal being time shifted with respect to said output pulse of said second stage to provide for a shift register operation; and a switching network responsive to said control signal for generating in a given row line, during a row select interval, a row line select signal that is time shifted with respect to said output pulse of said second stage, and for generating in said given row line a toggling, row line de-select signal, during a row de-select interval, that is buffered and decoupled from said input section of said third stage.

7. A row select scanner according to claim 6 wherein said switching network comprises a second transistor coupled to said row line for generating said row select line signal and a third transistor coupled to said row line and to a source of a toggling, second signal for generating said row line de-select signal.

8. A row select scanner according to claim 7 wherein said second and third transistors are coupled in a push-pull configuration.

9. A row select scanner according to claim 7 wherein said control signal is stored in a capacitance that is coupled to a control terminal of each of said first and second transistors for conditioning each of said first and second transistors to conduction.

10. A row select scanner according to claim 7 further comprising, a fourth transistor responsive to an output pulse signal of a stage downstream of said given stage for disabling said first and second transistors, during said row de-select interval.

11. A row select scanner according to claim 6 further comprising, a source of a toggling, second signal developed in common electrodes of said pixels and having, alternately, first and second levels, wherein said switching network includes a second transistor coupled to said row line for developing a voltage in a capacitance associated with said row line, in accordance with said second signal, during a first portion of a row de-select interval, and wherein said capacitance capacitively couples said second signal to said row line to develop said toggling row line de-select signal in said row line that is level shifted with respect to said second signal in accordance with said capacitance voltage, during a second portion of said row de-select interval.

12. A row select scanner according to claim 11 wherein said capacitance voltage is replenished by the operation of said second transistor after each time said second signal toggles.

13. A row select scanner according to claim 11 wherein said capacitance voltage is replenished by the operation of said second transistor once in each row de-select interval.

14. A shift register for a row select scanner of a matrix display, comprising:

a source of a plurality of phase shifted clock signals;

a plurality of cascaded stages, a given one of said cascaded stages, including:

an input section responsive to an output pulse signal developed at an output of a second stage of said cascaded stages for generating a control signal;

a first transistor responsive to said control signal for generating an output pulse signal of said given stage that is coupled to an input section of a third stage, said control signal conditioning said first transistor to generate said output pulse signal of said given stage when a clock signal is developed at a main current conducting terminal of said first transistor such that said output pulse signal of said given stage is time-shifted with respect to said output signal of said second stage;

a second transistor responsive to said control signal for generating a row line select signal in a corresponding row line, said control signal conditioning said second transistor to generate said row line select signal when a clock signal is developed at a main current conducting terminal of said second transistor such that said row line select signal is time-shifted with respect to said output signal of said second stage; and a third transistor coupled to said row line for generating in said row line a row de-select signal at a first level, during a first row de-select interval, and at a second level, during a second row de-select interval.

* * * * *